United States Patent [19]
Underwood et al.

[11] Patent Number: 5,583,787
[45] Date of Patent: Dec. 10, 1996

[54] METHOD AND DATA PROCESSING SYSTEM FOR DETERMINING ELECTRICAL CIRCUIT PATH DELAYS

[75] Inventors: Wilburn C. Underwood, Austin, Tex.; Haluk Konuk, Santa Cruz, Calif.; Sungho Kang; Wai-on Law, both of Austin, Tex.

[73] Assignee: Motorola Inc., Schaumburg, Ill.

[21] Appl. No.: 207,505

[22] Filed: Mar. 8, 1994

[51] Int. Cl.$^6$ .............................. G06F 11/00; G06F 17/50
[52] U.S. Cl. .............................. 364/489; 364/488; 371/27; 371/24; 371/22.3
[58] Field of Search .................................... 364/488, 578, 364/489; 371/22.1–22.5, 24, 27

[56] References Cited

U.S. PATENT DOCUMENTS

| | | | |
|---|---|---|---|
| 4,063,080 | 12/1977 | Eichelberger et al. | 371/62 |
| 4,672,307 | 6/1987 | Breuer et al. | 371/27 |
| 4,763,289 | 8/1988 | Barzilai et al. | 364/578 |
| 5,056,094 | 10/1991 | Whetsel | 371/25.1 |
| 5,206,861 | 4/1993 | Hannon et al. | 371/22.3 |
| 5,365,528 | 11/1994 | Agrawal et al. | 371/25.1 |
| 5,383,194 | 1/1995 | Sloan et al. | 371/22.1 |
| 5,422,891 | 6/1995 | Bushnell et al. | 371/22.4 |

OTHER PUBLICATIONS

"A Partial Scan Method for Sequential Circuits with Feedback" by K. Cheng et al, IEEE Trans. on Computers, vol. 39, No. 4, Apr. 1990, pp. 544–548.

"A Fault Oriented Partial Scan Design Approach" by V. Chickermane et al, IEEE 1991, pp. 400–403.

"On Determining Scan Flip–Flops in Partial–Scan Designs" by D. H. Lee et al, IEEE, ICCAD, 1990, pp. 322–325.

Primary Examiner—Vincent N. Trans
Attorney, Agent, or Firm—Keith E. Witek

[57] ABSTRACT

A test vector generator system (157) and method for generating test vectors for testing integrated circuit speed paths involves accessing both a circuit model (160) and a list of circuit paths (162). A single circuit path, referred to as a selected path, is selected from the paths (162), and a set of logic value constraints are set for logic devices in the selected circuit path. These logical constraints are set to ensure that a proper input-to-output transition, which is used to identify speed path faults, results in response to only two clock cycles. Once logical constraints are set, hazard-free logical values and logical values for both the second test clock cycle and the first test clock cycle are justified. Test vectors are generated in response to the justified values and the test vectors are serially shifted and double-clocked in an integrated circuit or electrical circuit manufactured in accordance with circuit model (160) to determine time delay path faults.

28 Claims, 8 Drawing Sheets

METHOD AND DATA PROCESSING SYSTEM FOR DETERMINING ELECTRICAL CIRCUIT PATH DELAYS

FIELD OF THE INVENTION

The present invention relates generally to data processing systems, and more particularly, to path delay testing of integrated circuits.

BACKGROUND OF THE INVENTION

The prior art in path-delay testing dates to 1985, with the definition of a delay model based on path delay faults. This initial paper and several other papers that followed it taught algorithms to generate tests for path-delay faults in combinational logic circuits. Due to the fact that nobody actually produces purely combinational circuits any more, the only way for these algorithms to be applied to a real circuit is essentially to double each memory device in the circuit so that it can store the two patterns (first clock cycle pattern and second clock cycle pattern) required for the path-delay test as completely independent patterns. This would roughly double the size of the memory portion of the circuit (the section 12 of FIG. 1), which no price-competitive manufacturer is willing to do. As a consequence, all these prior combinational logic approaches to path-delay testing remain largely academic exercises which cannot be used in modern integrated circuit design.

Test generation methods that could be applied to path-delay faults in standard scan sequential circuits first began to appear in 1991. These methods were the first to make feasible the path-delay testing of real circuits. Unfortunately, the methods described in all known papers/publications/patents that target standard scan sequential circuits used a simplified logic algebra that did not include hazard-free values. Hazard-free being a logic value that is to remain at the same logic level and is free of a timing glitch. As a consequence, the methods are unable to target robust tests, which means that any tests they generate may be invalidated by timing problems in other parts of the circuit. In other words, by not using hazard-free values a time delay fault may be inaccurately detected when a time delay fault really didn't occur or vice versa, an actual time delay fault could go unreported due to a static timing hazard. A recent testing method claims to be able to generate robust tests for general sequential circuitry, including standard scan sequential circuits. The absence of certain necessary logic values, however, means that this algorithm is defective and may declare a path untestable even when a robust test exists. None of the prior art provides an error-free method for generating robust tests for standard scan sequential circuitry.

SUMMARY OF THE INVENTION

The previously mentioned disadvantages are overcome and other advantages achieved with the present invention. In one form, the present invention comprises a method for generating a robust test for detecting path delay faults. The robust test requires a first clock cycle and a second clock cycle in order to execute. The method beginning by providing a database which identifies at least one circuit path from a circuit model wherein the circuit model models a serial scan circuit design. One path is selected from the at least one path wherein the one path is referred to as a selected path. The selected path includes at least one logic device. Logic value constraints are set for the at least one logic device along the selected path. Hazard-free logic values are determined in the circuit model which ensure that timing errors resulting from the selected path will be detectable. Logic values in the circuit model are determined for the second clock cycle, and logic values are determined in the circuit model for the first clock cycle. A test vector is generated from the logic values determined above.

In another form, the invention comprises a data processing system. The data processing system has a central processing unit (CPU) which is used to perform calculations using data and transfer data. A memory system, which is coupled to the CPU via a bus, stores a circuit model, a list of specific circuit paths of the circuit model, and a test vector generator. The test vector generator being executed via the CPU to access the list of specific paths. The list of specific paths and the circuit model being used by the test vector generator to generate hazard-free logic values and other logic values which are to be applied to an integrated circuit, which is manufactured from the circuit model, to determine time path delays of each path in the specific list of paths.

The present invention will be more clearly understood from the detailed description below in conjunction with the accompanying drawings.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention provides both a method and an apparatus used to perform robust path-delay testing of an integrated circuit. A circuit path refers to a connected series of elements of an integrated circuit, with the first element in the series referred to as the head of the path and the last element in the series referred to as the tail of the path. A path delay refers to the time required for a logic value change on the head of the path to cause a logic value change on all other elements in the circuit path up to the tail of the path. The speed at which an integrated circuit can work is determined by the largest of the path delays (most time consuming) in the entire integrated circuit. A timing error for such a circuit path is said to have occurred when a path delay exceeds the system clock cycle, which is the amount of time required for the system clock for the integrated circuit to go through one complete period. When a circuit path shows such a timing error, the circuit path is said to possess a path delay fault. A robust test for a path delay fault is a test that guarantees that the circuit response will differ from the expected/passing response whenever the path possesses a path delay fault, regardless of the presence or absence of path delay faults on other circuit paths.

For example, assume that a circuit path comprises a first scannable flip-flop which has an output coupled to an input of a AND gate wherein the AND gate has an output coupled to an input of a second scannable flip-flop. The first and second scannable flip-flops (and any clocked component/ circuit in the integrated circuit which contains the first and second scannable flip-flops) are clocked at a predetermined speed by applying a clock signal to the integrated circuit. In order to test this example circuit path, an initial logic value is scanned into a flip-flop preceding the first scannable flip-flop or is provided to an input pin to allow a logic value A to appear on the input of the first scannable flip-flop. This logic value A will not propagate to the output until the first scannable flip-flop is clocked. Also, an initial logic value B is provided at the output of the second scannable flip-flop. Assume for the sake of example that A=0 and B=1, although any combination of values may occur for any type of circuit path.

Various signals are set or predetermined (as discussed herein) along the circuit path to ensure that when A=0 is clocked into the first scannable flip-flop via a first clock cycle that the value A=0, when applied down the circuit path, results in B=1 changing to B=0 at a second clock cycle. Therefore, the A=0 has just one clock cycle from the time it is latched into the first scannable flip-flop to propagate down the circuit path and change B from a logic '1' to a logic '0'. If B stays a logic '1' after assertion of the second clock cycle, then the A=0 signal did not propagate through the circuit path in time to affect the second scannable flip-flop. This indicates that the clock speed is too fast for this circuit path (i.e. signals are not arriving at critical clocked inputs before the clocking is occurring. If the signal B is changed to a '0' from a '1' then the circuit path can properly operate at the current clock cycle and under current conditions.

Therefore, for every circuit path in an electrical circuit or integrated circuit, one can determine that a path X is operable up to 47 MHz, path Y is operable up to 113 MHz, and path Z is operable up to 80 MHz. This information can then be used to determine what clock speed is maximal for a given circuit or may be used to determine which exact circuit paths need to be redesigned to achieve a higher clock speed for a circuit. For example, if the circuit described above was to run at 60 MHz, path X would be a problem and most likely would require redesign, a new layout, or different manufacturing/processing.

The method of the present invention operates on a circuit model of an integrated circuit (usually a computer simulated model of an integrated circuit) and a database which identifies various circuit paths of this circuit model. The circuit model must be a circuit model in which all circuit memory elements are scannable flip-flops. A circuit path is selected from the set of circuit paths and a set of logic value constraints for elements of the circuit model that are required to achieve a path-delay test are determined. Some of these logic value constraints, referred to as hazard-free logic values, may be required to be free of timing hazards. Logic values which cause these hazard-free logic values to be produced in the circuit model are determined first. Next, logic values to cause logic value constraints for the second clock cycle to be produced in the circuit model are determined. Finally, logic values to cause logic value constraints for the first clock cycle to be produced in the circuit model are determined. A test vector comprises the logic values on input terminals for the integrated circuit and on the scannable flip-flops for the first clock cycle and is generated after all logical values have been set for both clock cycles one and two.

Figure 1:
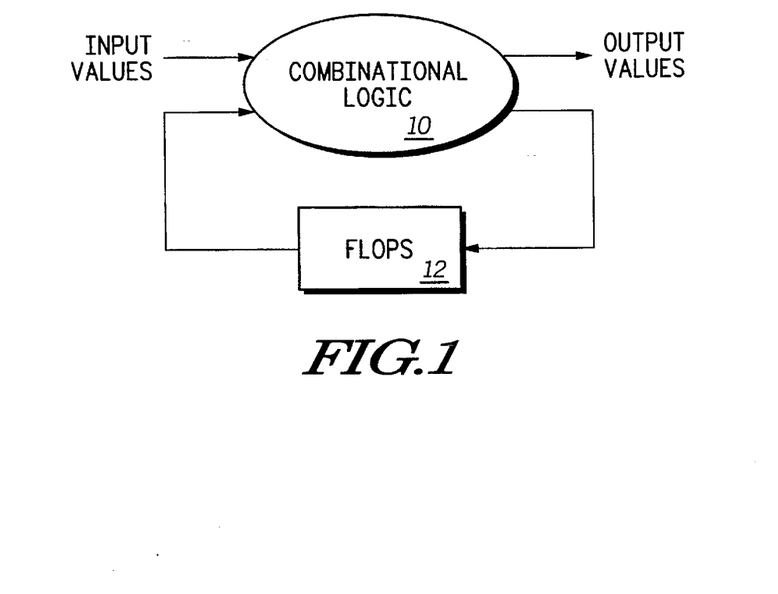
FIG. 1 illustrates, in a block diagram, a circuit which can be path delay tested in accordance with the present invention.

The present invention overcomes many of the disadvantages stated in the background and can be more fully understood with reference to the FIGS. 1–11 herein. FIG. 1 generally illustrates a portion of an integrated circuit having a set of scannable flip-flops 12 (i.e., storage devices) and a combinational logic section 10. FIG. 1 also illustrates input values which may come from other storage devices (i.e. scannable flip-flops) or integrated circuit input terminals (input pins). Output values are provided to storage devices or to external terminals (output pins) of the integrated circuit. A circuit path to be tested in this portion of an integrated circuit could consist of: (1) a connected series of circuit elements beginning with a circuit input terminal, containing at least one of the logic devices in the combinational logic section 10, and ending with an external terminal of the integrated circuit, (2) a connected series of circuit elements beginning with a storage device, containing at least one of the logic devices in the combinational logic section 10, and ending with an external terminal of the integrated circuit, (3) a connected series of circuit elements beginning with a circuit input terminal, containing at least one of the logic devices in the combinational logic section 10, and ending with a storage device, or (4) a connected series of circuit elements beginning with a storage device, containing at least one of the logic devices in the combinational logic section 10, and ending with a storage device.

Figure 2:
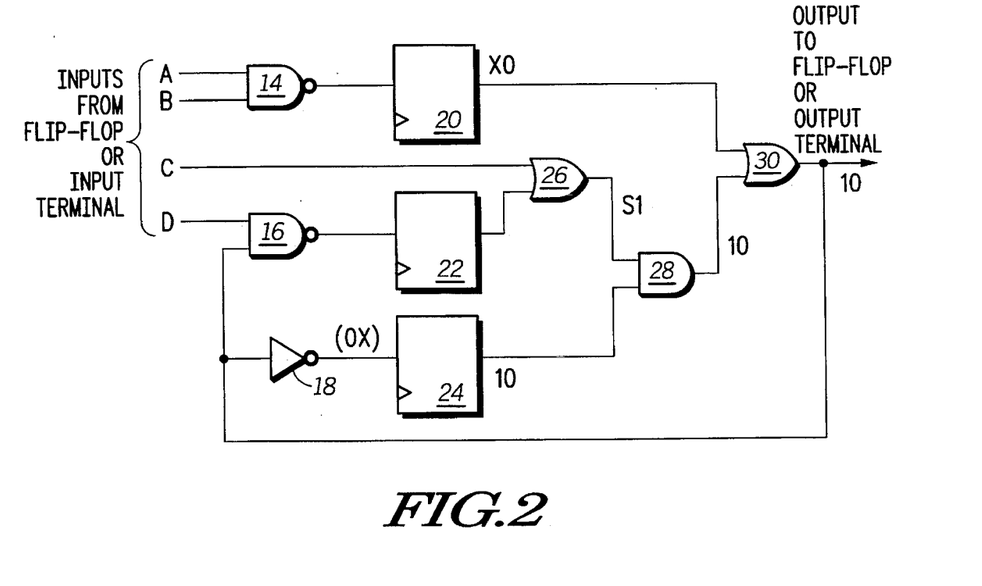
FIG. 2–5 illustrate, in block diagrams, a specific circuit which may be path delay tested and how test logic values are determined within the specific circuit in accordance with the present invention.

Although FIG. 1 illustrates a generic type of circuit which may be tested a specific example is most useful in understanding the path delay method discussed herein. FIGS. 2 through 5 illustrate a specific circuit which may be used to determine path delays. The scannable flip-flops 20, 22, and 24 correspond to the set of scannable flip-flops 12 of FIG. 1. The combinational logic devices 14, 16, 18, 26, 28, and 30 correspond to the combinational logic section 10 of FIG. 1. The example of a circuit path to be tested in this circuit is the path beginning with scannable flip-flop 24, the head of the path, containing combinational logic devices 28 and 30, and ending at the output to a scannable flip-flop or output terminal, the tail of the path. A test for a path delay fault on this circuit path must first establish the initial value on the head of the path, scannable flip-flop 24 (an initial value being output from flip-flop 24 which may be serially scanned into 24). After a first clock cycle, the first time interval in which the system clock for the integrated circuit goes through one complete period following the establishment of the initial value on the head of the path, the second value for the head of the path has been clocked into the storage element from the input (from inverter 18). After a second clock cycle, the second time interval in which the system clock for the integrated circuit goes through one complete period following the establishment of the initial value on the head of the path, the response value for the tail of the path has either been clocked into a storage element flip-flop or simply provided to the output terminal as indicated in FIG. 1. FIG. 2 illustrates the logic values that are necessary on the inputs and outputs of circuit devices on the example path in order to achieve a robust test of the example circuit path. These logic values are selected from the logic value set that has been designed to be used for test generation for path delay faults. This logic value set is given in TABLE 1 below.

clock cycle and latched as a '0' on the second clock cycle as indicated by the 10 label on the Output in FIG. 2.

Figure 3:
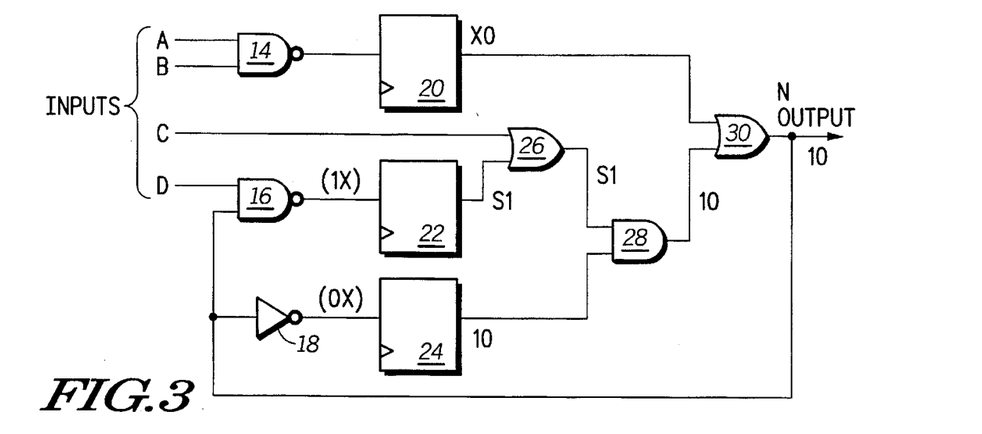

FIG. 3 illustrates the state of the circuit after justifying all the hazard-free logic values from FIG. 2. Justifying a logic value refers to the process of determining logic values in the circuit model, the determined logic values being assigned to circuit input terminals and to scannable flip-flops in such a way as to cause the logic value to be justified to occur in the circuit model and in the integrated circuit manufactured from the model. The only hazard-free value in FIG. 2 is the S1 that is placed on the OR gate 26, so FIG. 3 represents the changes made in the logic values of the circuit as a result of justifying this single hazard-free value. The output of OR 26

TABLE 1

| LOGIC VALUE | LOGIC VALUE FOR FIRST CLOCK CYCLE | LOGIC VALUE FOR SECOND CLOCK CYCLE | ADDITIONAL INFORMATION |
| --- | --- | --- | --- |
| 00 | 0 | 0 | Not guaranteed hazard-free but can be made into S0 |
| 01 | 0 | 1 | Rising transition for path test |
| 0Y | 0 | Y | Y represents both Z and signals constrained to X |
| 0X | 0 | X | Can be made into S0 |
| 10 | 1 | 0 | Falling transition for path test |
| 11 | 1 | 1 | Not guaranteed hazard-free but can be made into S1 |
| 1Y | 1 | Y | Y represents both Z and signals constrained to X |
| 1X | 1 | X | Can be made into S1 |
| Y0 | Y | 0 | Y represents both Z and signals constrained to X |
| Y1 | Y | 1 | Y represents both Z and signals constrained to X |
| YY | Y | Y | Y represents both Z and signals constrained to X |
| YX | Y | X | Y represents both Z and signals constrained to X |
| X0 | X | 0 | Can be made into S0 |
| X1 | X | 1 | Can be made into S1 |
| XY | X | Y | Y represents both Z and signals constrained to X |
| XX | X | X | Can be made into S0 or S1 |
| S0 | 0 | 0 | Guaranteed hazard-free |
| S1 | 1 | 1 | Guaranteed hazard-free |
| SZ | Z | Z | Guaranteed hazard-free |
| 00T | 0 | 0 | Cannot be made into S0 |
| 0XT | 0 | X | Cannot be made into S0 |
| X0T | X | 0 | Cannot be made into S0 |
| XT0 | X | X | Cannot be made into S0 |
| 11T | 1 | 1 | Cannot be made into S1 |
| 1XT | 1 | X | Cannot be made into S1 |
| X1T | X | 1 | Cannot be made into S1 |
| XT1 | X | X | Cannot be made into S1 |
| XTB | X | X | Cannot be made into S0 or S1 |

For example, a logic value 10 (see the Output of FIG. 2) represents a value that is logic 1 during the first clock cycle and logic 0 during the second clock cycle, the logic value S1 represents a value that is logic 1 for both the first and second clock cycles and is free of any static timing hazard during these two clock cycles, logic value X0 represents a value that is logic 0 for the second clock cycle but whose logic value is not specified (a don't care) for the first clock cycle, and logic value 0X represents a value that is logic 0 for the first clock cycle but whose logic value is not specified for the second clock cycle. Since scannable flip-flop 24 has a value of logic '0' during the second clock cycle, the INVERTER 18 must input a value of logic '0' to the flip-flop 24 during the first clock cycle so that the system clock will cause this logic value '0' to be latched into the scannable flip-flop 24 during the second clock cycle, which is the reason that the logic value 0X has been listed as a required logic value for the INVERTER 18. If the path is functional at the operating speed, the Output of FIG. 2 will be initially '1' on the first must be hazard-free due to the fact that the input from flip-flop 24 is a logical 10.

For example, if one input of the AND gate 28 is 10 (one in the first clock cycle and zero in the second clock cycle), then the output of OR 26 must be one in the first clock cycle to ensure that the output of AND 28 is a one in the first clock cycle. Furthermore, in the second clock cycle the output of OR 26 must be a one to ensure that the one to zero transition of the output of flip-flop 24 is the only input that alters the output of AND 28 in order to properly measure the selected circuit path. In other words, if the output of OR 26 is ever allowed to be zero even for a timing hazard's short time frame, the path under test is adversely affected and may not result in a proper determination of a path delay fault. The selected path (from flip-flop 24 to the Output) may be incorrectly deemed path delay functional at the given frequency because of a static hazard through gate 26.

In general, a static timing hazard is said to occur when a signal is to remain at the same logic level for some time period but changes to the opposite logic level on a transient basis before returning to its final value. For example, a signal that is to remain at logic 0 for two clock cycles may change briefly (i.e., "spike") to logic 1 at the start of the second clock cycle before settling back to its final value of logic 0.

In order to produce a hazard-free logic 1 (S1 in the logic value set used in this invention) on the output of an OR gate, it is only necessary to have S1 on at least one of the inputs of the OR gate. In this example circuit, we may choose either of two input devices to produce this hazard-free logic 1 and the choice has been arbitrarily made to assign S1 to the scannable flip-flop 22. Since the scannable flip-flop 22 must have logic value 1 during the second clock cycle as a consequence of the definition of the S1 value, the NAND gate 16 must have a value of logic 1 during the first clock cycle so that the system clock will cause this logic value to be latched into the scannable flip-flop 22 for the second clock cycle, which is the reason that the logic value 1X has been listed as a required logic value for the NAND gate 16.

Figure 4:
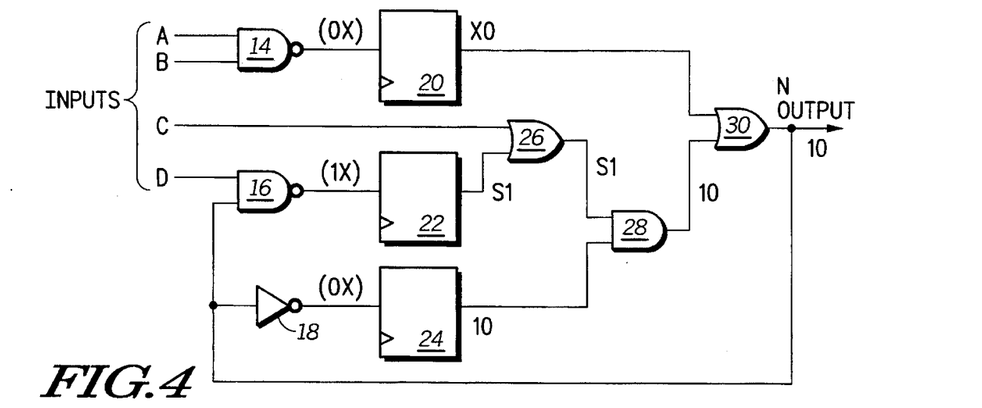

FIG. 4 illustrates the state of the circuit after justifying all the logic values for the second clock cycle from FIG. 3. The only value in FIG. 3 for the second clock cycle is the X0 that is placed on the scannable flip-flop 20, so FIG. 4 represents the changes made in the logic values of the circuit as a result of justifying this single value for the second clock cycle. Since the scannable flip-flop 20 must have logic value 0 during the second clock cycle, the NAND gate 14 must have a value of logic 0 during the first clock cycle so that the system clock will cause this logic value to be latched into the scannable flip-flop 22 for the second clock cycle, which is the reason that the logic value 0X has been listed as a required logic value for the NAND gate 14 in FIG. 4.

Figure 5:
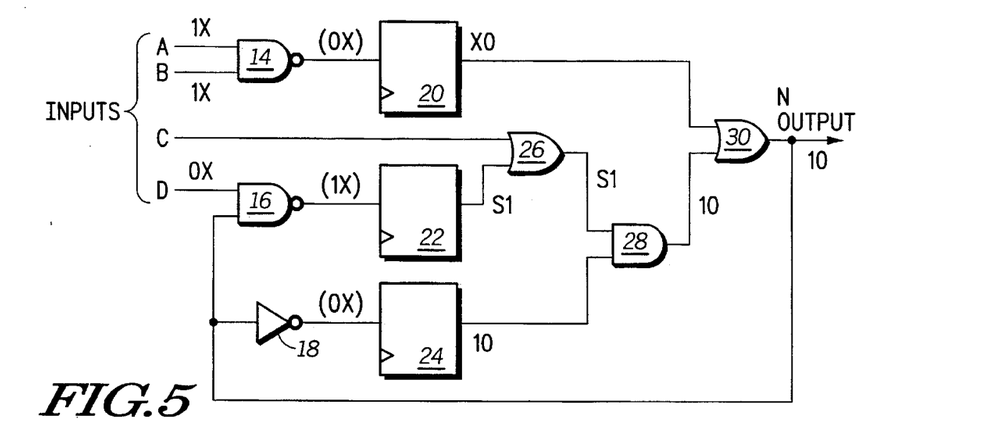

FIG. 5 illustrates the state of the circuit after justifying all the logic values for the first clock cycle from FIG. 4. The values in FIG. 4 for the first clock cycle are the 0X on the output of the NAND gate 14, the 1X on the output of the NAND gate 16, and the 0X on the output of the INVERTER 18. Therefore, FIG. 5 represents the changes made in the logic values of the circuit as a result of justifying these values for the first clock cycle. In order to produce a value of 0X on the NAND gate 14, it is necessary that all its input devices have a value of logic 1 in the first clock cycle, so the two circuit input terminals that are connected to the NAND gate 14 have both been assigned values of 1X. To produce a value of 1X on the NAND gate 16, it is only necessary that one of its input devices have a value of logic 0 for the first clock cycle. Since the input that comes from the OR gate 30 has value 10, it is necessary to assign the 0X value to the circuit input terminal that provides the other input to the NAND gate 16. Finally, to produce a 0X on the INVERTER 18, it is necessary that its input device have a value of logic 1 during the first clock cycle and the OR gate 30, which is the input device for the INVERTER 18, already has a value of logic 1 during the first clock cycle due to the requirement that its output change from logic 1 to logic 0 because it is on the circuit path to be tested. At this point the test vector for the example circuit and example path has been completely generated. The test vector consists of logic 1 during the first clock cycle on the circuit input terminals (both of them) that are connected to the NAND gate 14, logic 0 during the first clock cycle on the circuit input terminal that is connected to the NAND gate 16, logic 1 to be serially shifted into the scannable flip-flop 22 (since the first clock cycle value of logic value S1 is a logic 1) and logic 1 to be serially shifted into the scannable flip-flop 24 (since the first clock cycle value of logic value 10 is a logic 1).

Note that all circuit logic devices on the circuit path to be tested have undergone a transition from logic 1 in the first clock cycle to logic 0 in the second clock cycle, which is called a falling transition. This will not always be the case. One reason for this is that the specification of the test to be produced may require that the head of the path undergo a transition from logic 0 in the first clock cycle to logic 1 in the second clock cycle, which is called a rising transition. A second reason is that some combinational logic devices on the path to be tested may be inverting devices, such as an INVERTER, a NAND gate or a NOR gate. A rising transition on an input to an inverting device will produce a falling transition on the output and a falling transition on the input will produce a rising transition on the output, so some combinational logic devices on the path to be tested may undergo one type of transition while other combinational logic devices on the path undergo the opposite type of transition. Finally, some of the combinational logic devices on the path to be tested may be either inverting or non-inverting, depending on the value of other inputs. For example, a two-input EXCLUSIVE-OR gate will invert an input transition if its other input is S1 but will not invert the transition if its other input is S0. The particular type of transition to be undergone by each of the combinational logic devices on the path to be tested will change the input logic values that are required to achieve a robust test of the path.

Given the example illustrated via FIGS. 2–5, FIG. 6 illustrates a flowchart which describes how a robust speed path test vector is generated for any circuit. In a step 32, a path is selected from the list of paths for which path-delay tests are to be generated. In a step 34, certain required logic values for the path-delay test are determined from the description of the path and the circuit model, and these required values are set as constraints on the state of the circuit model that must be satisfied if a test is to be generated. These logic value constraints are then justified, in a particular order depending on the type of constraint that is required. The first logic value constraints to be justified are the hazard-free values that are required to be free of timing hazards, which is accomplished in a step 36. Next the logic value constraints for the second clock cycle are justified in a step 38, and finally the logic value constraints for the first clock cycle are justified in a step 40. In a step 42, the test generation result is checked to see if values have been successfully determined to justify all the required logic value constraints, and if they have been successfully generated then a test vector is declared to have been generated and is saved as an output result vector in a step 46. If all possible values are tried (implicitly) and it proves impossible to justify all the required logic value constraints, then the selected path is declared to be untestable in a step 44. Only two clock cycles are required for this test because the integrated circuit is required to have scannable flip-flops as memory elements. This means that the first set of values required for the test vector can be serially shifted into the memory elements rather than having to be produced by the functionality of the integrated circuit.

Figure 6:
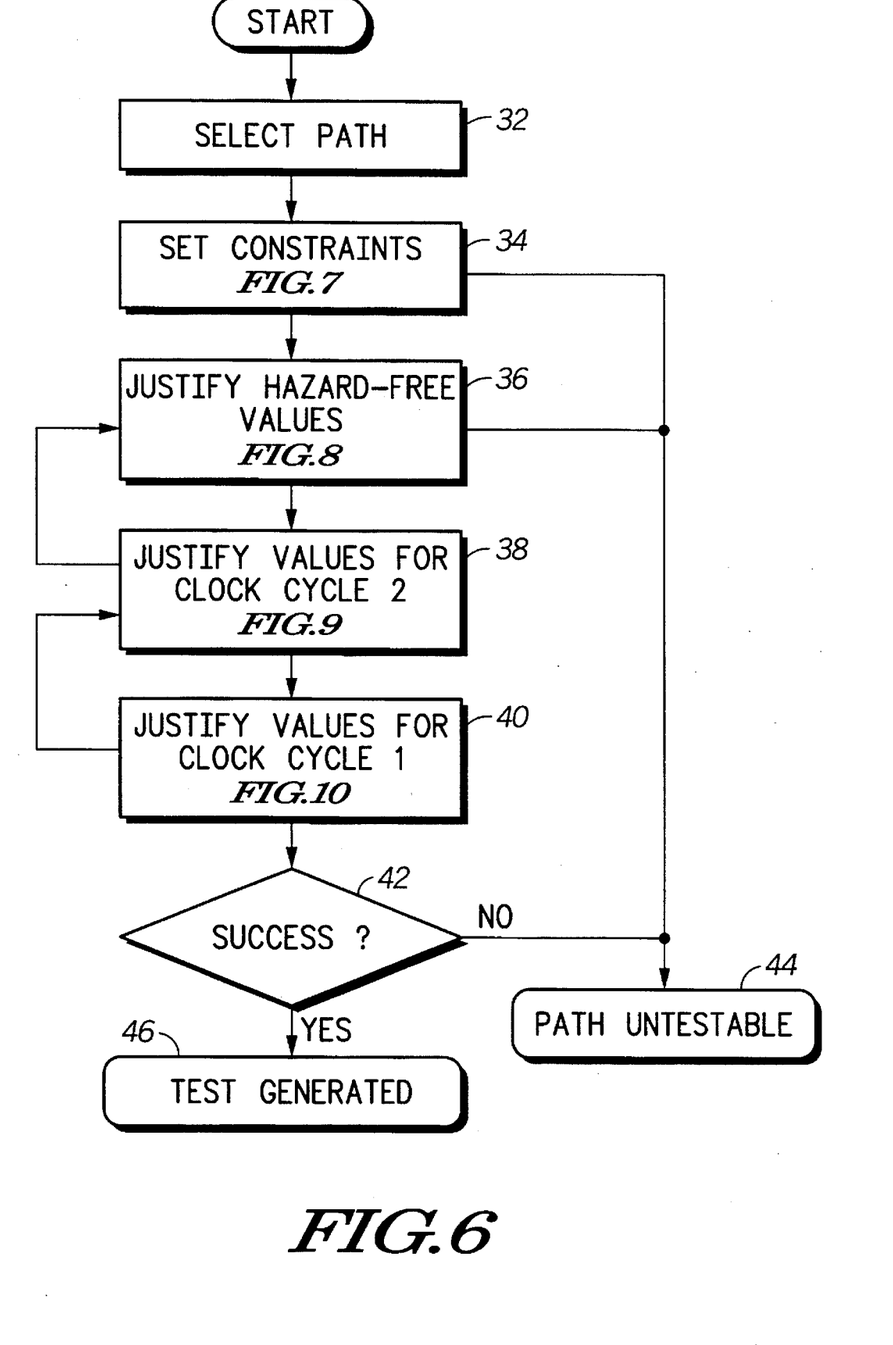
FIG. 6 illustrates, in a flowchart, a method for generating a test vector which is used to test a delay path in an electrical circuit in accordance with the present invention.
Figure 7:
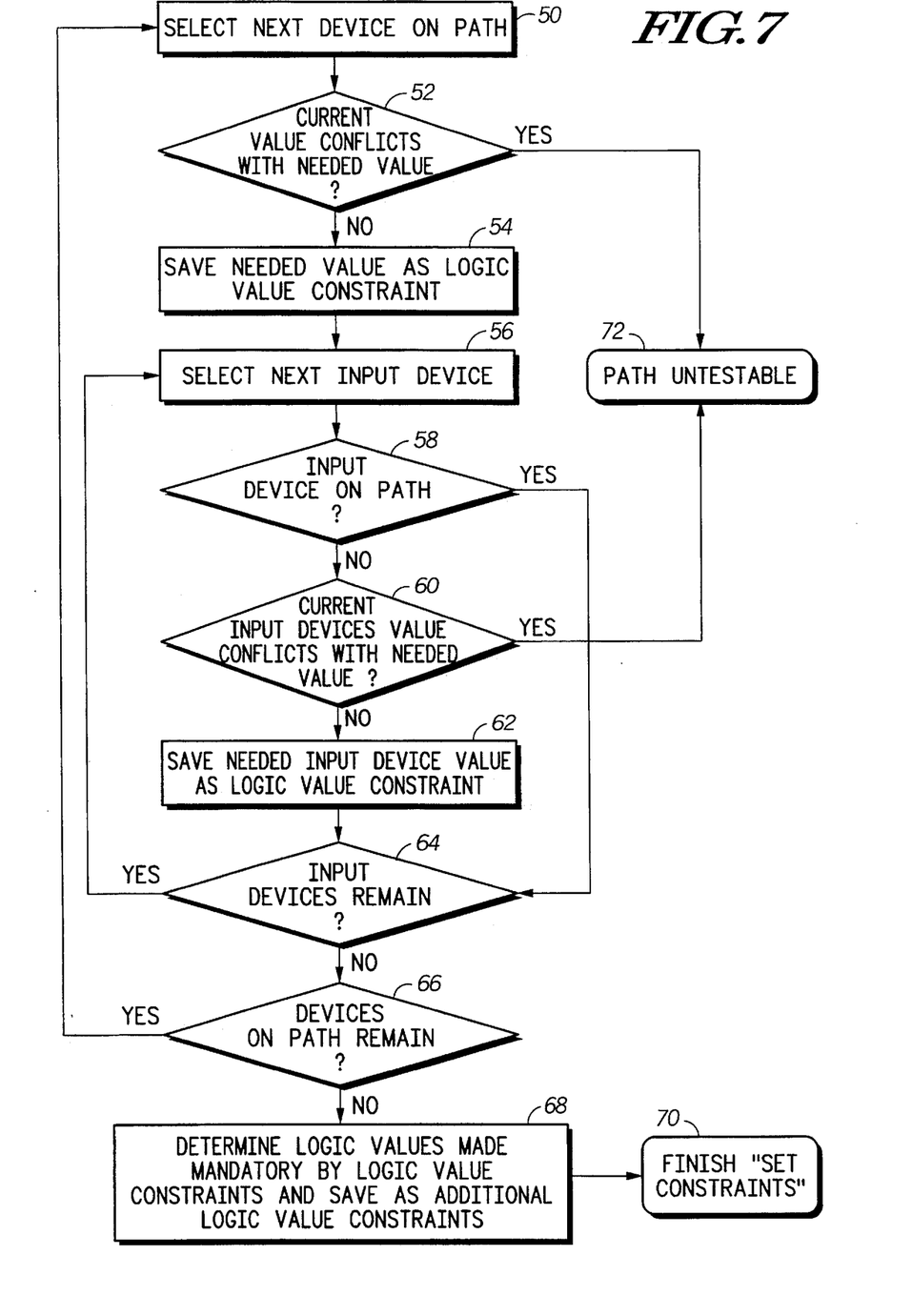
FIG. 7 illustrates, in a flowchart, several specific steps involved when setting logic constraints as illustrated in FIG. 6 in accordance with the present invention.

FIGS. 7–10 illustrate flowcharts wherein each flowchart further explains a step in FIG. 6. FIG. 7 illustrates the flowchart for the step 34 in FIG. 6. First, the next device on the circuit path to be tested is selected in a step 50. The current logic value on this circuit device is checked against the required logic value constraint for the device in a step 52. If the current logic value conflicts with the required logic value constraint, then it is not possible to satisfy the required logic value constraints and the path is declared to be untestable in a step 72. If the current logic value on the circuit device does not conflict with the required logic value constraint, then the required logic value constraint is saved as part of the record for the selected circuit device in a step 54. The next circuit device that is connected to the input pins of the selected circuit device is examined in a step 56. This input device is checked to see if it is on the circuit path to be tested in a step 58. If it is, then no further action is taken on the input device since it will previously have been a selected circuit device in the step 50 and its logic value constraints will already have been saved in the step 54, so flow moves to the step 64.

If the input device is not on the circuit path to be tested, then the current logic value of the input device is checked to see if it conflicts with the required logic value constraints for the input device in a step 60. If the current logic value of the input device does conflict with the required logic value constraint for the input device, then it is not possible to satisfy the required logic value constraints and the path is declared to be untestable in the step 72. If the current logic value of the input device does not conflict with the required logic value constraint for the input device, then in a step 62 the required logic value constraint is saved as part of the record for the input device. In a step 64, the selected circuit device is checked to see if there are other input devices that have not yet been examined and if there are, then the flow returns to the step 56. If there are no more unexamined input devices for the selected circuit device, then in a step 66 the path description is checked to see if there are more circuit devices on the path to be tested that have not yet been selected and if there are, then the flow returns to the step 50.

If there are no more circuit devices on the path to be tested that have not yet been selected, then a step 68 checks the circuit devices with logic value constraints to determine if there are other logic values made mandatory by these logic value constraints and if so, these other mandatory logic values are saved as additional logic value constraints for the circuit model. The step 68 is accomplished by a technique, known as backward implication, which is common to test generation procedures. For example, a value of logic 1 for an AND gate implies (requires) that all input devices for the AND gate also have a value of logic 1. Another example, is that an OR gate having a zero output requires that all inputs have a zero value. Following step 68, the Set Constraints procedure is exited in a step 70.

Figure 8:
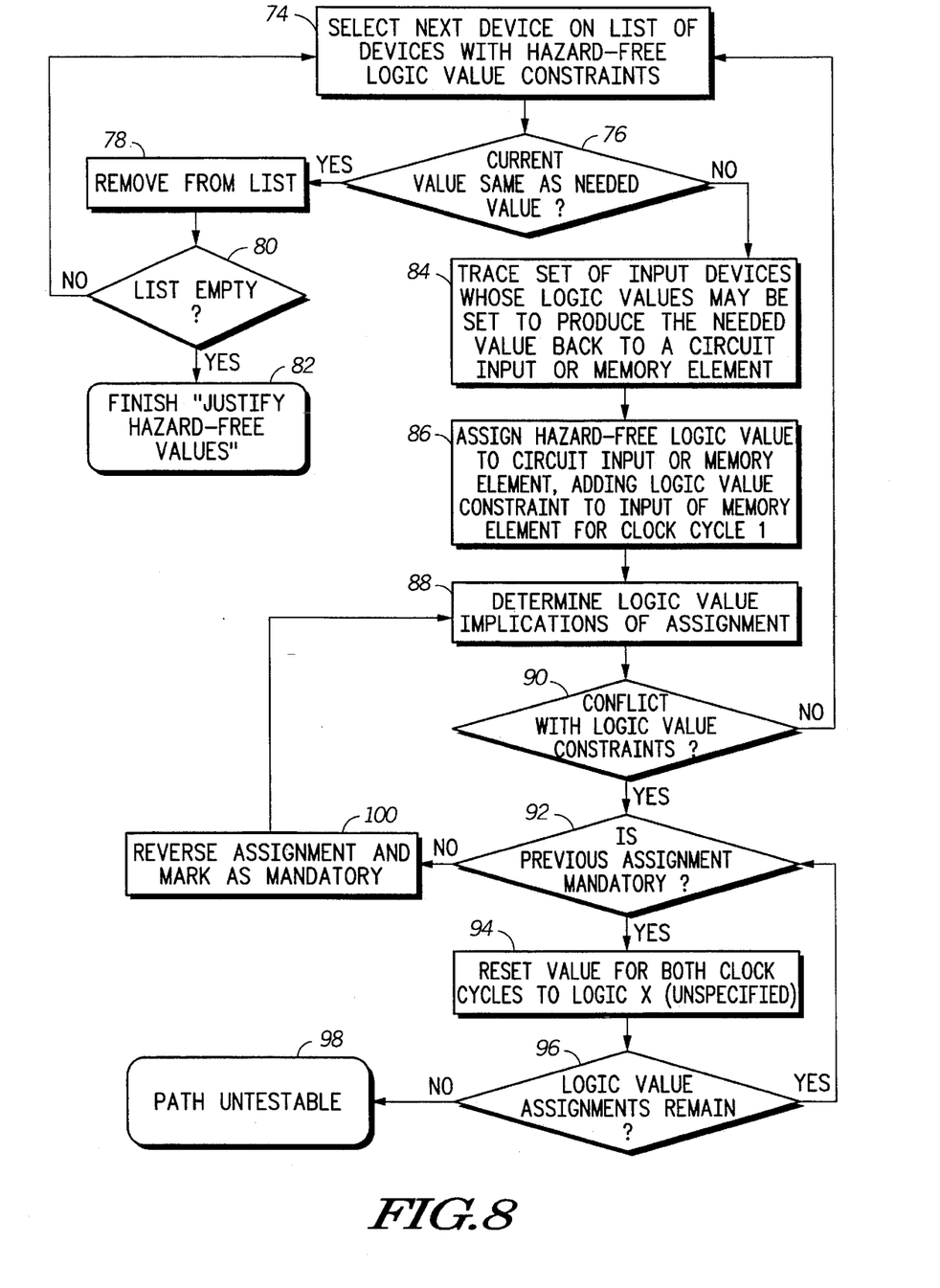
FIG. 8 illustrates, in a flowchart, several specific steps which are involved when justifying hazard-free logic values as illustrated in FIG. 6 in accordance with the present invention.

FIG. 8 illustrates the flowchart for the step 36 in FIG. 6. In a step 74 the next circuit device on the list of devices with hazard-free logic value constraints is selected. The selected circuit device is examined to see if its current logic value is the same as the logic value required by the logic value constraint in a step 76. If the current logic value is not the same as the logic value required by the logic value constraint, then in a step 84 a process of backtracing from the input devices of the selected circuit device is initiated. This process of backtracing consists of selecting an input device whose current logic value (and logic value constraint, if any such exists for this input device) is compatible with the input logic value needed to produce the hazard-free logic value specified by the logic value constraint on the selected logic device. When such an input device is identified, then the backtracing process is applied to the identified input device and this continues iteratively until a circuit input terminal or a scannable flip-flop is encountered. At this point, the hazard-free logic value that is needed to assist in producing the hazard-free logic value on the initially selected circuit device is assigned to the circuit input terminal or scannable flip-flop in a step 86. A step 88 performs a logic simulation to determine the logic value implications of the logic value assignment made in the step 86. Circuit devices that are simulated are checked for conflict with their logic value constraints in a step 90. If no conflict is determined in the step 90, the flow returns to the step 74. If there is conflict between the current logic value and the logic value constraint for some circuit element in the step 90, then a step 92 examines the previous logic value assignment to see if it is a mandatory assignment, i.e., an assignment that is either required to have its present value by some logic value constraint in the circuit model, or has already had the inverse hazard-free value simulated and found to cause conflict. If the previous assignment is not mandatory, then in a step 100 its hazard-free logic value assignment is inverted and marked as mandatory and flow returns to the step 88. If the previous assignment is mandatory, then in a step 94 the circuit input terminal or scannable flip-flop to which the assignment had been made is returned to an unspecified state (logic value X) and the record of the previous logic value assignment is removed from the list of such records. A step 96 examines the list of records of logic value assignments to see if more records remain on the list. If there are more records on the list, flow returns to the step 92. If there are no more records of logic value assignments on the list, then all possible logic value assignments have been tried and found to produce conflict with required logic value constraints, so the path is declared untestable in a step 98. If the examination in the step 76 reveals that the current logic value is the same as the logic value required by the logic value constraint, then the selected logic device is simply removed from the list of devices with hazard-free logic value constraints in a step 78. A step 80 examines the list of circuit devices with hazard-free logic value constraints to see if the list is empty. If the step 80 reveals that the list is not empty, then flow returns to the step 74. If the step 80 reveals that the list is empty, then the Justify Hazard-free Values procedure is exited in a step 82.

Figure 9:
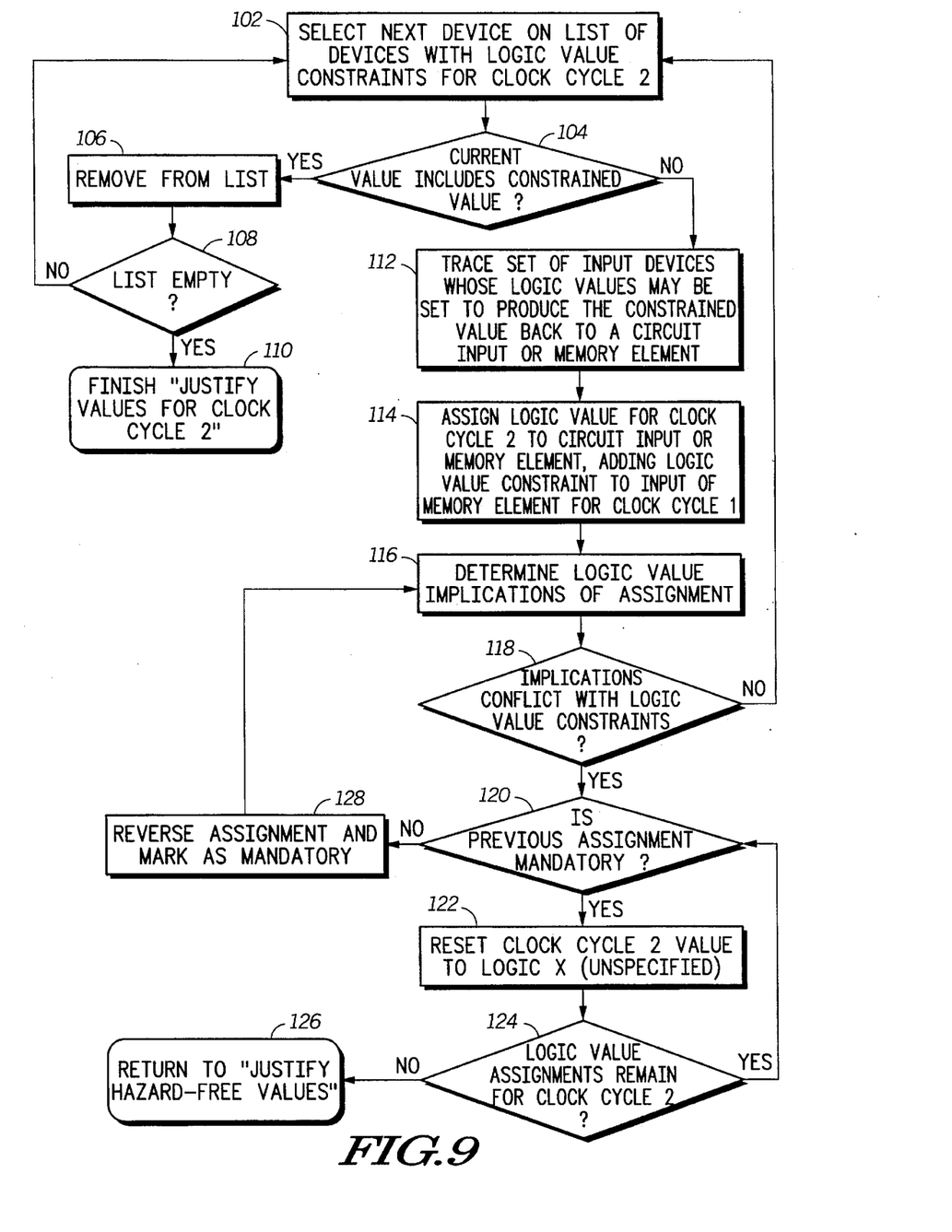
FIG. 9 illustrates, in a flowchart, several specific steps which are involved when justifying values for a second clock cycle as illustrated in FIG. 6 in accordance with the present invention.

FIG. 9 illustrates the flowchart for the step 38 in FIG. 6. A step 102 selects the next circuit device on the list of devices with logic value constraints for the second clock cycle. A step 104 examines the selected circuit device to see if its current logic value includes the logic value required by the logic value constraint. A first logic value is said to include a second logic value if all the requirements for the second logic value are also met by the first logic value. If the current logic value does not include the logic value required by the logic value constraint, then a step 112 initiates a process of backtracing from the input devices of the selected circuit device. This consists of selecting an input device whose current logic value (and logic value constraint, if any such exists for this input device) is compatible with the input logic value needed to produce the value required by the logic value constraint for the second clock cycle on the selected logic device. When such an input device is identified, then the backtracing process is applied to the identified input device and this continues iteratively until a circuit input terminal or a scannable flip-flop is encountered. At this point, the logic value that is needed to assist in producing the value required by the logic value constraint for the second clock cycle on the initially selected circuit device is assigned to the circuit input terminal or scannable flip-flop in a step 114. A step 116 performs a logic simulation to determine the logic value implications of the logic value assignment made in the step 114. Circuit devices that are simulated are checked for conflict with their logic value constraints in a step 118. If no conflict is determined in the step 118, the flow returns to the step 102. If there is conflict between the current logic value and the logic value constraint for some circuit element in the step 118, a step 120 examines the previous logic value assignment to see if it is a mandatory assignment, i.e., an assignment that is either required to have its present value by some logic value constraint in the circuit model or has already had the inverse value for the second clock cycle simulated and found to cause conflict. If the previous assignment is not mandatory, then its logic value assignment is inverted and marked as mandatory in a step 128 and flow returns to the step 116. If the previous assignment is mandatory, a step 122 returns the circuit input terminal or scannable flip-flop to which the previous logic value assignment had been made to an unspecified state (logic value X) for the second clock cycle and the record of the previous logic value assignment is removed from the list of such records. A step 124 examines the list of records of logic value assignments to see if more records remain on the list. If there are more records on the list, flow returns to the step 120. If there are no more records of logic value assignments on the list, then all possible logic value assignments for the second clock cycle have been tried and found to produce conflict with required logic value constraints, so some of the hazard-free assignments made in the step 36 of FIG. 6 have made it impossible to complete the generation of the test vector, so a step 126 returns to the step 36 of FIG. 6 to attempt to find a different assignment of hazard-free values that will allow the successful generation of a test vector. If the step 104 reveals that the current logic value does include the logic value required by the logic value constraint, a step 106 removes the selected logic device from the list of devices with logic value constraints for the second clock cycle. A step 108 examines the list of circuit devices with logic value constraints for the second clock cycle to see if the list is empty. If the step 108 reveals that the list is not empty, then flow returns to the step 102. If the step 108 reveals that the list is empty, then the Justify Values For Clock Cycle 2 procedure is exited in a step 110.

Figure 10:
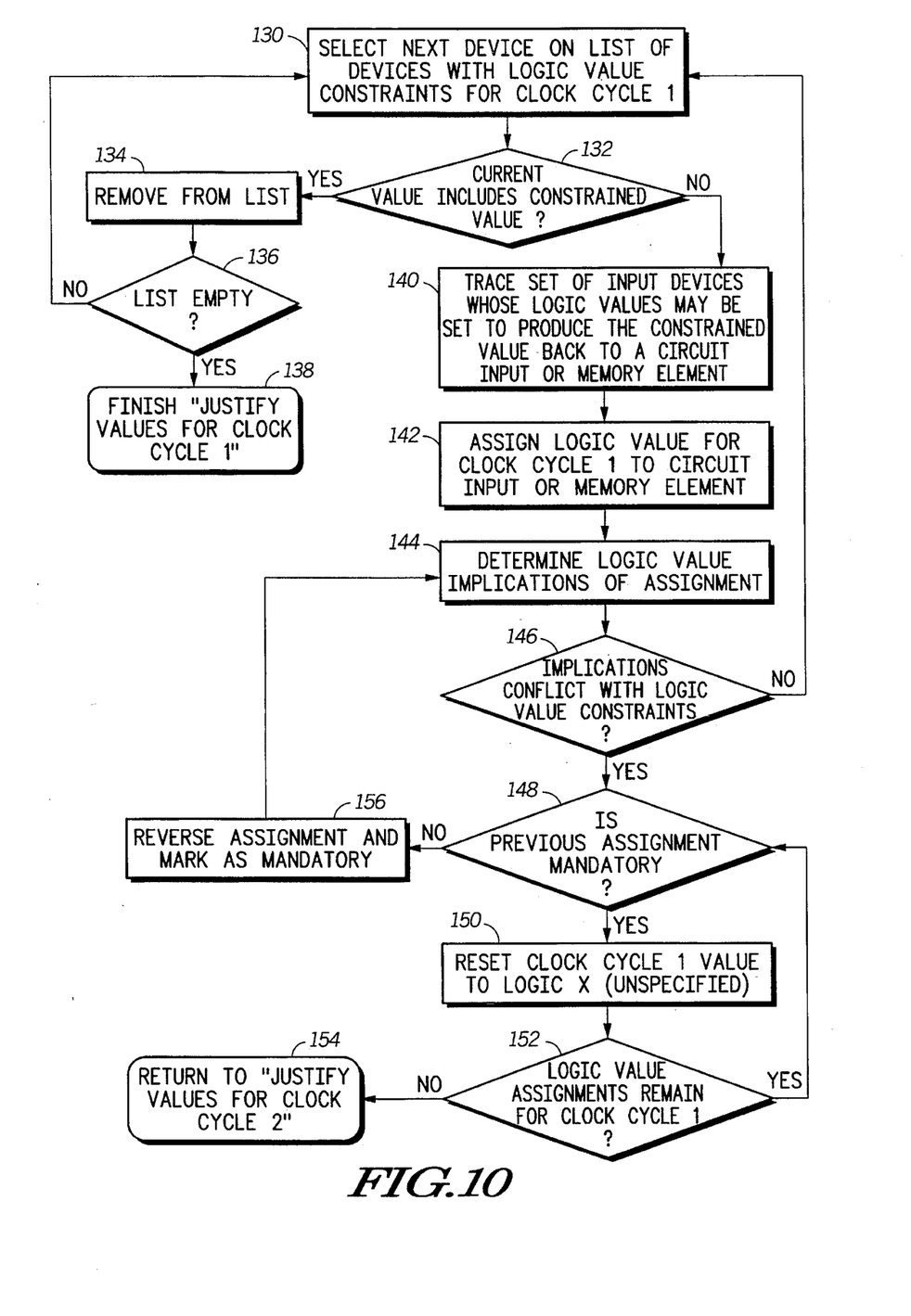
FIG. 10 illustrates, in a flowchart, several specific steps which are involved when justifying values for a first clock cycle as illustrated in FIG. 6 in accordance with the present invention.

FIG. 10 illustrates the flowchart for the step 40 in FIG. 6. A step 130 selects the next circuit device on the list of devices with logic value constraints for the first clock cycle. A step 132 examines the selected circuit device to see if its current logic value includes the logic value required by the logic value constraint. If the current logic value does not include the logic value required by the logic value constraint, then a step 140 initiates a process of backtracing from the input devices of the selected circuit device. This process of backtracing consists of selecting an input device whose current logic value (and logic value constraint, if any such exists for this input device) is compatible with the input logic value needed to produce the value required by the logic value constraint for the first clock cycle on the selected logic device. When such an input device is identified, then the backtracing process is applied to the identified input device and this continues iteratively until a circuit input terminal or a scannable flip-flop is encountered. At this point, the logic value that is needed to assist in producing the logic value required by the logic value constraint for the first clock cycle on the initially selected circuit device is assigned to the circuit input terminal or scannable flip-flop in a step 142. A step 144 performs a logic simulation to determine the logic value implications of the logic value assignment made in the step 142. Circuit devices that are simulated are checked for conflict with their logic value constraints in a step 146. If no conflict is determined in the step 146, the flow returns to the step 130. If there is conflict between the current logic value and the logic value constraint for some circuit element in the step 146, a step 148 examines the previous logic value assignment to see if it is a mandatory assignment, i.e., an assignment that is either required to have its present value by some logic value constraint in the circuit model or has already had the inverse logic value for the first clock cycle simulated and found to cause conflict. If the previous assignment is not mandatory, then its logic value assignment for the first clock cycle is inverted and marked as mandatory in a step 156 and flow returns to the step 144. If the previous assignment is mandatory, then the circuit input terminal or scannable flip-flop to which the previous assignment had been made is returned to an unspecified state (logic value X) for the first clock cycle and the record of the previous logic value assignment is removed from the list of such records in a step 150. A step 152 examines the list of records of logic value assignments to see if more records remain on the list. If there are more records on the list, flow returns to the step 148. If there are no more records of logic value assignments on the list, then all possible logic value assignments for the first clock cycle have been tried and found to produce conflict with requires logic value constraints, so some of the assignments for the second clock cycle made in the step 38 of FIG. 6 have made it impossible to complete the generation of the test vector and a step 154 returns to the step 38 of FIG. 6 to attempt to find a different assignment of values for the second clock cycle that will allow the successful generation of a test vector. If the examination in the step 132 reveals that the current logic value does include the logic value required by the logic value constraint, a step 134 removes the selected logic device from the list of devices with logic value constraints for the first clock cycle. A step 136 examines the list of circuit devices with logic value constraints for the first clock cycle to see if the list is empty. If the step 136 reveals that the list is not empty, then flow returns to the step 130. If the step 136 reveals that the list is empty, then the Justify Values For Clock Cycle 1 procedure is exited in a step 138.

Figure 11:
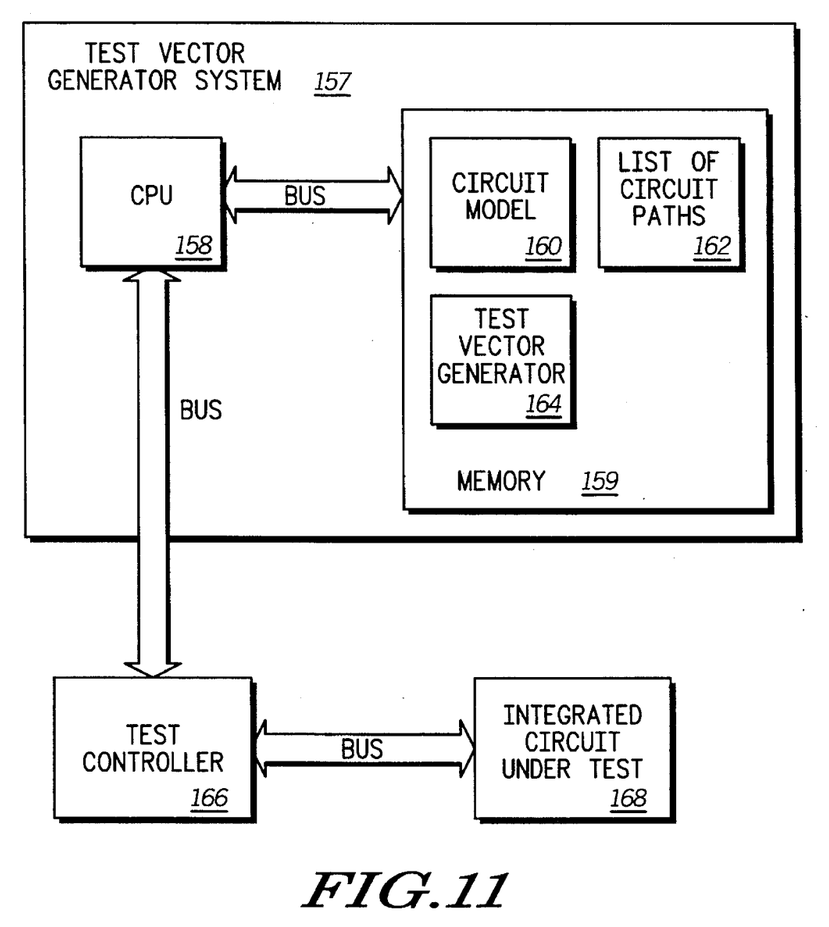
FIG. 11 illustrates, in a block diagram, a data processing system which may be used to path delay test an integrated circuit in accordance with the present invention.

FIG. 11 illustrates a system which may be used to generate speed path test vectors and then speed path test an integrated circuit using the generated test vectors and a test apparatus. FIG. 11 illustrates a central processing unit (CPU) 158, which is coupled to a memory system 159 via a bus. The memory 159 stores a circuit model 160, a list of circuit paths 162, and a test vector generator 164. The CPU 158 executes the generator 164 which accesses the circuit model 160 and the list of circuit paths 162 to generate test vectors, as taught herein, for every testable path in the list of circuit paths 162. These test vectors are then communicated to a test controller 166 which is used to clock and/or provide the test vectors to the integrated circuit under test 168. The test controller 166 and the link between the test controller 166 and the circuit under test 168 comprise the test apparatus. This providing of test vectors and reading of results by the controller 166 is used to derive delay path and speed path information from the actual integrated circuit 168, and may be performed multiple times with varying clock rates in order to derive more precise speed path information. The test controller to be used here may be any one of several types of devices. One example of a test controller is a production electronic digital tester, such as a Teradyne J971. A second example of a test controller is a laboratory tester such as a Hewlett-Packard 82000. Still another example of a test controller would be a specialized logic device that could be constructed especially to link the Test Vector Generator System 157 to the Integrated Circuit Under Test 168. The Test Vector Generator System 157 could also be any one of several types of systems, such as an engineering workstation, a personal computer, a large mainframe computer, or a multiprocessing supercomputer.

The software illustrated herein (such as the elements 160, 162, and 164 in FIG. 11) is stored on one of either a magnetic media (a disk, a compact disk (CD), a tape, a drum, a ferromagnetic device), electrical storage such as random access memory (RAM), static random access memory (SRAM), fast static random access memory (FSRAM), dynamic random access memory (DRAM), flash devices, read only memory (ROM), electrically programmable read only memory (EPROM), electrically erasable read only memory (EEPROM), ferroelectric memory, or like memory media for binary data, source code, object code, or like computer data. The instructions in a computer program may be viewed as English-type instruction on paper or binary/ASCII values stored in either memory cells or magnetic media.

While the present invention has been shown and described with reference to specific embodiments, further modifications and improvements will occur to those skilled in the art. For example, the transfer of the generated test vectors to the test controller 166 in FIG. 11 could be done by other means, such as tape or floppy disk, rather than by a bus. There are several steps in the method for generation of test vectors that could be done slightly differently. The use of a many-valued logic algebra could be avoided by keeping a record of which choices had already been tried at each node in the circuit at which a decision had to be made, for example at a three-input AND gate whose output is to be set to a hazard-free logic zero. The logic algebra actually employed in this invention is only a subset of a more complete algebra in which each possible logic value for the first clock cycle (0,1,X,Y) is combined with each possible value for the second clock cycle (0,1,X,Y) and the possible hazard-free status (hazard-free, not yet hazard-free but may be made to be so, cannot be made hazard-free). This combination would provide 48 logic values, which would be substantially more unwieldy than the logic algebra used in this invention.

While the justification hazard-free logic values (the step 36 of FIG. 6) must be done prior to the justification of either values for clock cycle 2 (the step 38 of FIG. 6) or values for clock cycle 1 (the step 40 of FIG. 6), it was chosen to justify values for the second clock cycle (the step 38) prior to justifying values for the first clock cycle (the step 40) for reasons of efficiency rather than of necessity. One could even mix the justification of values for clock cycle 1 and clock cycle 2, with no fixed order, without completely invalidating the method. Finally, there are some standard improvements to test generation approaches for stuck-at faults that could be applied equally well to the present invention. For example, static or dynamic learning procedures, the use of statically or dynamically computed testability measures as heuristics to guide internal choices, and the saving of values that have previously produced certain internal circuit states could all be applied to this invention. It is to be understood, therefore, that this invention is not limited to the particular forms illustrated and that it is intended in the appended claims to cover all modifications that do not depart from the spirit and scope of this invention.

What is claimed is:

1. A method for generating a robust test for detecting path delay faults, the robust test requiring a first clock cycle and a second clock cycle to execute, the method comprising the steps of:

(a) providing a database identifying at least one circuit path from a circuit model wherein the circuit model models a serial scan circuit design;

(b) selecting one path from the at least one path, the one path being referred to as a selected path, the selected path including at least one logic device;

(c) determining logic value constraints for the at least one logic device along the selected path;

(d) determining hazard-free logic values in the circuit model which ensure that timing errors resulting from the selected path will be detectable;

(e) determining logic values in the circuit model for the second clock cycle;

(f) determining logic values in the circuit model for the first clock cycle; and (g) generating a test vector from the logic values determined in steps (e) and (f).

2. The method of claim 1 wherein one of the steps of determining comprises:

generating logic values which are to be serially shifted into storage elements defined by the circuit model.

3. The method of claim 1 wherein one of the steps of determining comprises:

generating logic values which are to be provided to input terminals of an integrated circuit defined by the circuit model.

4. The method of claim 1 wherein one of the steps of determining comprises:

generating logic values which are to be provided by both an integrated circuit scannable flip-flop and an input terminals of an integrated circuit defined by the circuit model.

5. The method of claim 1 further comprising the step of:

transferring the test vector to a test apparatus which uses the test vector to test an integrated circuit containing a circuit defined by the circuit model, the test vector providing speed path information for the selected path.

6. The method of claim 1 further comprising the step of:

transferring the test vector to a test apparatus which applies the test vector as input to an integrated circuit M times wherein M is a finite integer greater than zero, the integrated circuit containing a circuit defined by the circuit model, integrated circuit being clocked at a different frequency each of the M times in order to determine at which frequency a circuit path in the integrated circuit fails to operate properly.

7. The method of claim 1 further comprising the step of:

checking the progress of at least one of the four steps of determining and indicating that the selected path is not testable if the at least one of the four steps of determining fails to properly set the corresponding logic values.

8. The method of claim 1 further comprising the step of:

serially shifting the test vector into an integrated circuit to allow for testing of the integrated circuit, the integrated circuit being in accordance with the circuit model.

9. The method of claim 8 further comprising the step of:

serially shifting an output result vector from the integrated circuit to a storage device external to the integrated circuit, the output result being used to determine speed path information.

10. The method of claim 1 further comprising the steps of:

applying the test vector to an integrated circuit wherein the integrated circuit is made in accordance with the circuit model; and clocking the integrated circuit at least twice to propagate the test vector values through a portion of the integrated circuit in order to test the selected path.

11. The method of claim 1 further comprising the steps of:

applying the test vector to an integrated circuit wherein the integrated circuit is made in accordance with the circuit model;

clocking the integrated circuit at least twice to propagate the test vector values through a portion of the integrated circuit in order to test the selected path by producing a test result; and reading the test result from at least one output terminal of the integrated circuit.

12. The method of claim 1 further comprising the steps of:

applying the test vector to at least one input terminal of an integrated circuit wherein the integrated circuit is made in accordance with the circuit model.

13. A data processing system, comprising:

a central processing unit (CPU) which is used to perform calculation and transferring of data; and a memory system coupled to the CPU via a bus, the memory system storing a circuit model of a serial scan architecture, a list of specific circuit paths of the circuit model, and a test vector generator, the test vector generator being executed via the CPU to access the list of specific paths, the list of specific paths and the circuit model being used by the test vector generator to generate hazard-free logic values and other logic values which are to be applied to an integrated circuit, which is manufactured from the circuit model, to determine time path delays of each path in the specific list of paths.

14. A method for generating a robust test for detecting path delay faults, the robust test requiring a first clock cycle and a second clock cycle to execute, the method comprising the steps of:

(a) providing a database identifying at least one circuit path from a circuit model;

(b) selecting one path from the at least one path, the one path being referred to as a selected path, the selected path including at least one logic device;

(c) determining logic value constraints for the at least one logic device along the selected path;

(d) determining hazard-free logic values in the circuit model which ensure that timing errors resulting from the selected path will be detectable;

(e) determining logic values in the circuit model for the second clock cycle;

(f) determining logic values in the circuit model for the first clock cycle;

(g) generating a test vector from the determined logic values;

(h) transferring the test vector to a test device;

(i) applying the test vector, via the test device, to an integrated circuit designed in accordance with the circuit model;

(j) clocking the integrated circuit two times to propagate test vector data through the selected path within the integrated circuit to a predetermined point in the integrated circuit, the step of clocking being performed at a predetermined frequency; and (k) accessing an output logic value stored at the predetermined point in the integrated circuit to determine if the test vector executed properly through the selected path at the predetermined frequency.

15. The method of claim 14 wherein the steps (b) through (k) are repeated a predetermined number of times in order to test more than one selected path within the integrated circuit.

16. The method of claim 14 wherein the steps (b) through (k) are repeated a predetermined number of times to test a single selected path at several different integrated circuit clock rates.

17. A method for generating a robust test for detecting path delay faults, the robust test requiring a first clock cycle and a second clock cycle to execute, the method comprising the steps of:

(a) selecting a circuit path within a circuit model;

(b) determining any required hazard-free values which affect the circuit path in the circuit model, assign logic value constraints to the required hazard-free values;

(c) determining any logical input values required for the second clock cycle;

(d) determining any logical input values required for the first clock cycle;

(e) generating an input vector in response to at least one step of determining (b) through (d); and (f) repeating steps (a) through (f) for a predetermined number of circuit paths to generate one or more input vectors.

18. The method of claim 17 further comprising the steps of:

(g) applying the one or more test vectors to an integrated circuit made in accordance with the circuit model;

(h) clocking the integrated circuit a plurality of times; and (i) reading information from the integrated circuit, the information being used to determine path delay times within the integrated circuit.

19. The method of claim 17 wherein the step (b) comprises:

determining constraint logic values along the circuit path, the constraint logic values being required in order to properly time delay test the circuit path.

20. The method of claim 19 wherein the step of determining constraint logic values along the circuit path comprises:

(g) selecting a device in the circuit path;

(h) determining any constraint logic values required for one or more terminals of the device;

(i) determining if any of the constraint logic values required for the device are in conflict with any other required constraint logic values, and if conflict results then the path is determined to be untestable under current logical conditions; and (j) repeat steps (g) through (i) for all other devices in the circuit path.

21. The method of claim 19 wherein the step of determining constraint logic values along the circuit path comprises:

(g) selecting a primary device in the circuit path;

(h) determining any constraint logic values required for one or more terminals of the primary device;

(i) determining any constraint values required for any input devices which affect a logic value of the primary device to ensure that the constraint logic values required for one or more terminals of the primary device are possible given the logic of the input devices;

(j) determining if any of the constraint logic values required for the primary device or any input devices are in conflict with any other required constraint logic values, and if conflict results then the path is determined to be untestable under current logical conditions; and (j) repeat steps (g) through (i) for all other devices in the circuit path.

22. The method of claim 17 wherein the step (b) comprises:

determining hazard-free logic values along the circuit path, the hazard-free logic values being required in order to properly time delay test the circuit path.

23. The method of claim 17 wherein step (c) comprises:

selecting a primary device in the circuit path having logic value constraints for the second clock cycle;

tracing all devices which have at least one input which affects an input of the primary device back to one of either an integrated circuit input terminal or a storage device which is capable of being scanned; and fixing at least one logic value in either the integrated circuit input terminal or the storage device which is capable of being scanned in order to ensure that the logic value constraints for the primary device are met for the second clock cycle.

24. The method of claim 17 wherein step (d) comprises:

selecting a primary device in the circuit path having logic value constraints for the first clock cycle;

tracing all devices which have at least one input which affects an input of the primary device back to one of either an integrated circuit input terminal or a storage device which is capable of being scanned; and fixing at least one logic value in either the integrated circuit input terminal or the storage device which is capable of being scanned in order to ensure that the logic value constraints for the primary device are met for the first clock cycle.

25. A path delay tester using a first test clock cycle and a second test clock cycle to test a circuit model for path delay faults, the path delay tester comprising:

means for identifying and providing a plurality of circuit paths defined within the circuit model wherein the circuit model characterizes a scan sequential circuit;

means for setting logical value constraints on inputs of logical devices which logically affect a selected circuit path within the plurality of circuit paths;

means for justifying at least one hazard-free logical value being input to a logical device which logically affects the selected circuit path within the plurality of circuit paths;

means for justifying at least one logical value of the second test clock cycle, the at least one logical value of the second test clock cycle logically affecting the selected circuit path; and means for justifying at least one logical value of the first test clock cycle, the at least one logical value of the first test clock cycle logically affecting the selected circuit path.

26. The path delay tester of claim 25 wherein the path delay tester further comprises:

means for generating a test vector in response to the at least one hazard-free value, the at least one logical value of the first test clock cycle and the at least one logical value of the second test clock cycle.

27. The path delay tester of claim 25 wherein the path delay tester further comprises:

means for generating a test vector in response to the at least one hazard-free value for the selected circuit path; and means for applying the test vector to an integrated circuit formed in accordance with the circuit model, the test vector being input to the integrated circuit while the integrated circuit is operating at an operating frequency to determine if the selected circuit path properly operates at the operating frequency.

28. The path delay tester of claim 25 wherein the path delay tester further comprises:

means for generating a test vector in response to the at least one hazard-free value for the selected circuit path; and means for applying the test vector to an integrated circuit formed in accordance with the circuit model, the means for applying the test vector applying the test vector to the integrated circuit a plurality of times, the integrated circuit operating at a different operating frequency each of the times in the plurality of times to determine at what operating frequency the specific circuit path fails.

* * * * *